(12) United States Patent
Frankenberger

(10) Patent No.: US 9,663,246 B2
(45) Date of Patent: May 30, 2017

(54) METHOD FOR INSTALLING AN ELECTRIC SYSTEM INTO AN AIRCRAFT FUSELAGE

(71) Applicant: Airbus Operations Gmbh, Hamburg (DE)

(72) Inventor: Eckart Frankenberger, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 777 days.

(21) Appl. No.: 14/016,829

(22) Filed: Sep. 3, 2013

(65) Prior Publication Data
US 2014/0167500 A1    Jun. 19, 2014

Related U.S. Application Data

(60) Provisional application No. 61/696,601, filed on Sep. 4, 2012.

(30) Foreign Application Priority Data

Sep. 4, 2012   (EP) .................................... 12182914

(51) Int. Cl.
*B64F 5/00*     (2006.01)
*B64D 45/00*   (2006.01)
(Continued)

(52) U.S. Cl.
CPC .............. *B64F 5/0009* (2013.01); *B64C 1/12* (2013.01); *B64D 45/00* (2013.01); *H05K 3/125* (2013.01);
(Continued)

(58) Field of Classification Search
CPC ......... B64F 5/0009; B64C 1/12; B64D 45/00; B64D 2221/00; H05K 3/125; H05K 2203/013; H05K 3/28; Y10T 29/49155
(Continued)

(56) References Cited

U.S. PATENT DOCUMENTS

| 5,437,058 A | 7/1995 | Grosz et al. |
| 2005/0098684 A1* | 5/2005 | Gullerud ................ B64D 13/08 244/129.1 |

(Continued)

FOREIGN PATENT DOCUMENTS

| EP | 0 601 739 | 6/1994 |
| GB | 2 460 174 | 11/2009 |
| WO | WO 2010/049730 | 5/2010 |

OTHER PUBLICATIONS

European Search Report for Application No. EP 12 18 2914 dated Feb. 6, 2013.
(Continued)

*Primary Examiner* — Jared Fureman
*Assistant Examiner* — Emmanuel R Dominique
(74) *Attorney, Agent, or Firm* — Jenkins, Wilson, Taylor & Hunt, P.A.

(57) ABSTRACT

A method for installing an electric system into an aircraft fuselage. The object to provide a method for simply and quickly installing an electric system into an aircraft fuselage, wherein the electric system is as little heavy and space consuming as possible, and wherein a wide range of customized alternatives of the electric system is possible, is achieved by the steps of providing a fuselage element extending along an aircraft longitudinal axis and including an outer skin and an interior surface, providing a foil sheet of an electrically insulating substrate material, attaching said foil sheet on the inner side of said fuselage element, applying particles of electrically conductive material onto the inner surface of said attached foil sheet opposite the outer skin in a predetermined pattern, such that the accumulated particles of electrically conductive material form electric conductor elements along said inner surface of said foil sheet.

12 Claims, 4 Drawing Sheets

(51) Int. Cl.
*H05K 3/12* (2006.01)
*B64C 1/12* (2006.01)
*H05K 3/28* (2006.01)

(52) U.S. Cl.
CPC ............ *B64D 2221/00* (2013.01); *H05K 3/28* (2013.01); *H05K 2203/013* (2013.01); *Y10T 29/49155* (2015.01)

(58) Field of Classification Search
USPC .......................................................... 307/9
See application file for complete search history.

(56) References Cited

U.S. PATENT DOCUMENTS

| | | | |
|---|---|---|---|
| 2005/0211835 A1* | 9/2005 | Henley .................. | B64D 11/06 244/118.6 |
| 2008/0028956 A1* | 2/2008 | Sedberry .................. | H01Q 1/42 101/129 |
| 2009/0184877 A1* | 7/2009 | Bommer ................ | H01Q 1/007 343/708 |
| 2013/0153277 A1* | 6/2013 | Menard ............... | H01L 21/6835 174/260 |

OTHER PUBLICATIONS

Chinese Office Action and Search Report for Application No. 201310397691.9 dated Oct. 27, 2015.

\* cited by examiner

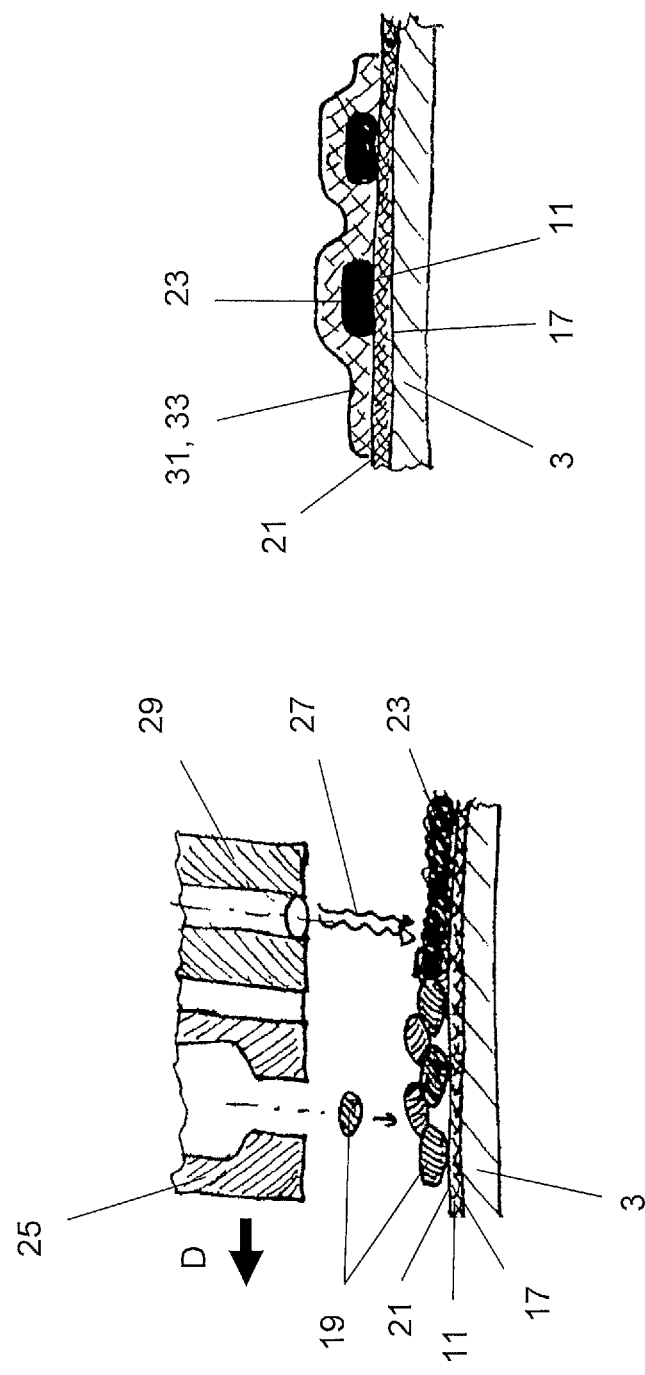

METHOD FOR INSTALLING AN ELECTRIC SYSTEM INTO AN AIRCRAFT FUSELAGE

CROSS-REFERENCE TO RELATED APPLICATIONS

This application claims priority to and the benefit of European Patent Application No. EP 12182914.7 and to U.S. Provisional Application No. 61/696,601, both of which were filed on Sep. 4, 2012, the entire disclosures of which are both incorporated by reference herein.

TECHNICAL FIELD

The present invention relates to a method for installing an electric system into an aircraft fuselage. A further aspect of the present invention relates to an aircraft fuselage element being provided with an electric system.

BACKGROUND

An electric system within the meaning of the present invention may basically be any kind of electric system including electric conductor elements for conducting electric current through said fuselage, in particular electric conductor elements and electric circuit elements usually arranged in an aircraft between the fuselage structure, i.e. the outer skin and the supporting elements, and the interior fitting, i.e. the cabin wall parts.

Such electric systems installed in aircraft fuselages known in the art usually comprise a plurality of large cable looms which extend between the fuselage structure and the interior fitting in parallel to said fuselage longitudinal axis and the properties and dimensions of which are adapted to the requirements of the specifically customized interior fitting and intended use of the respective aircraft. Thus, one disadvantage of the electric systems of fuselages known in the art is that the high extent of cable looms which is necessary for power supply, control signals and data transfer in the latest aircrafts involves considerable weight and space requirement, which both negatively affect efficiency of an aircraft design.

Another disadvantage of the prior art fuselage electric systems is that a quick and simple exchange of parts of said electric system, which may be desirable e.g. for service or customizing purposes, is considerably difficult, as the entire cable looms or other electric system parts have to be removed or dismounted to merely change or add e.g. single cables. Such disassembly of the electric system for service or customizing purposes is time-consuming and cost-intensive. Moreover, the range of customization is limited by the predetermined dimensions and properties of available cables, cable looms, and further electric system parts.

A further disadvantage of the prior art fuselage electric system is that the installation of said systems into a fuselage during aircraft construction is considerably complex and time-consuming, as a large amount of cables and other electric parts, such as plug connectors or electric circuit elements, has to be provided, assembled, and mounted into said fuselage.

SUMMARY

Therefore, it is the object of the present invention to provide a method for simply and quickly installing an electric system into an aircraft fuselage, wherein the electric system is as little heavy and space consuming as possible, and wherein a wide range of customized alternatives of the electric system is possible.

This object is achieved by a method for installing an electric system into an aircraft fuselage, said method comprising the steps of:
a. providing a fuselage element extending along an aircraft longitudinal axis and comprising an outer skin and an interior surface,
b. providing a foil sheet of an electrically insulating substrate material,
c. attaching said foil sheet on the inner side of said fuselage element,
d. applying particles of electrically conductive material onto the inner surface of said attached foil sheet opposite the outer skin in a predetermined pattern, such that the accumulated particles of electrically conductive material form electric conductor elements along said inner surface of said foil sheet.

In such a manner by using a flexible foil sheet attached to the inner side of the fuselage element as a substrate element and by subsequently coating electric conductor elements onto said foil sheet a simple and quick method for installing an electric system into a fuselage is provided. Said foil sheet coated with electric conductor elements can easily be removed and replaced by a new plain uncoated foil sheet which, subsequently, can be coated with e.g. an updated or differently customized assembly of electric conductor elements. The process of installing the electric system inside a fuselage during aircraft construction may be highly accelerated and simplified, as the predetermined pattern in which particles of electrically conductive material are applied onto the inner surface of said foil sheet may be executed by a computer controlled particle applying device. No manually connecting of cables or cable looms is necessary any more. Also connection errors can easily be reduced.

Moreover, a fuselage electric system comprising merely a coated foil sheet consumes only a minimum of space and weights much less than the cable looms which are to be replaced by said foil sheet. In summary, by the method according to the present invention efficiency of the process of aircraft construction and servicing as well as efficiency of said aircraft in use may be considerably increased.

A fuselage element within the meaning of the present invention may be either an entire aircraft fuselage or only a fuselage section. A fuselage section may be a section in the direction of the fuselage longitudinal axis and/or an angular section, i.e. a complete circumferential cylinder shell or only an angular section of said cylinder shell.

The substrate material may be of any flexible electrically insulating material. The foil sheet may be bent such that it is adjusted to said inner side of the fuselage element, before it is attached thereto. In particular, the foil sheet may be attached onto the inner side of the outer skin, the supporting elements, e.g. frames and stringers, or onto separate clamping elements connected to the outer skin or the supporting elements. The foil sheet is preferably attached to said fuselage inner side in such a way that it can not move or shake inside said fuselage. The thickness of the foil sheet may be adapted to the required stiffness of the foil. The application of particles of electrically conductive material is carried out by a respective computer controlled particle applying device, such as a digital printing device. Such device may be adapted to be positioned and operate inside an enclosed fuselage element.

Particles of electrically conductive material within the meaning of the present invention may be of any kind of material suitable for conducting electric current, in particular a metallic material such as copper, aluminium, wolfram, brass, iron, chrome, or associated alloys, a semiconductor material such as silicon, or a non-metallic material such as graphite.

The predetermined patterns, i.e. the topography, the lateral size and the width, according to which the particles of electrically conductive material are applied onto the aircraft structure component are controlled by the temporal variation of the position at which said particles of electrically conductive material are applied onto said inner surface of the foil sheet, as well as on the mass flow rate of said particles of electrically conductive material which are applied onto said inner surface of the foil sheet. In this manner, such patterns control the extent, in particular the thickness, width, and length, as well as the direction and shape of the extension of the electric conductor elements, i.e. the predetermined patterns define the paths and the shape as well as the properties of the electric conductor elements.

According to a preferred embodiment subsequent to applying particles of electrically conductive material onto said inner surface of said foil sheet, the following step is performed:

e. applying particles of electrically insulating material onto the inner surface of said foil sheet and onto the electric conductor elements in a predetermined pattern, such that the accumulated particles of electrically insulating material form an insulating layer for the electric conductor elements.

Particles of electrically insulating material within the meaning of the present invention may for example be a plastic or ceramic material. However, other materials such as insulating lacquers may be employed as well. The particles for application may be of the same electrically insulating material as the substrate material of the foil sheet.

The particles of electrically insulating material may be applied onto the inner surface of the foil sheet and onto the particles of electrically conductive material forming electric conductor elements, so that the insulating layer insulates the electric conductor elements to the environment. However, the insulating layer may be formed discontinuously, so that at certain locations the electric conductor element is not insulated and may be connected to another electric conductor element by e.g. a plug or a switch.

In particular, it is preferred that step d. and step e. are carried out repeatedly in such an order and by means of such predetermined patterns that an electric circuit element having a layered structure is formed on the inner surface of said foil sheet. An electric circuit element within the meaning of the present invention may be any kind of electric circuit element, for example a resistor, a diode, a transistor, a capacitor, an inductor, an operational amplifier, or other circuit elements. In particular, switches, sensors and actuators may be formed in such a manner.

Layers of particles of electrically insulating material and layers of particles of electrically conductive material may be applied to the inner surface of the foil sheet alternately, wherein each layer is formed in such a way that a certain structure of electric conductor elements is embedded in a matrix of electric insulating material, thereby together forming an electric circuit element or elements. Also, carbon nano tubes being part of electric circuit elements may be employed by being admixed to the particles of electrically conductive material. Thus, this embodiment facilitates the formation of actuators like switches or lighting elements on the inner surface of the foil sheet.

In another preferred embodiment the particles of electrically conductive material and/or the particles of electrically insulating material are applied onto the inner surface of the foil sheet and onto the electric conductor elements by means of an ink jet printing device. Such ink jet printing device may be any kind of ink jet printing device, in particular a drop on demand ink jet printing device having a bubble jet print head, a piezo print head, or a pressure valve print head. Further, the operation of the ink jet printing device, in particular the operation of the print head, is preferably controlled by a digital controlling device which is adapted to be programmed for controlling the print head to apply particles of electrically conductive material and particles of electrically insulating material onto the inner surface of the foil sheet in a predetermined pattern.

The ink jet printing device may also comprise a distance sensor adapted to measure the distance between the print head and the respective position on the surface to be coated, so that for different distances a different amount of particles of electrically conductive or electrically insulating material may be applied to said surface in order to form a preferably planar outer surface of the insulating layer and/or electric conductor element. Multiple print heads applying particles of electric conductive material and particles of electric insulating material in parallel are also conceivable. Further, a laser device may be provided directly on or separate from the ink jet printing device in order to apply laser radiation onto the particles of electrically conductive and/or electrically insulating material, thereby laser sintering the electric conductor element and the insulating layer, respectively. The ink jet printing device may be constructed, such that it may also operate in the inside of an enclosed fuselage In yet another preferred embodiment subsequent to applying particles of electrically conductive material onto the inner surface of said foil sheet, the following step is performed:

d.1 subjecting the particles of electrically conductive material to laser radiation by means of a laser device, such that the particles melt due to the heat transferred to the particles through the laser radiation, thereby forming integrally formed electric conductor elements.

That means the particles are laser sintered. The laser device may be any kind of laser device adapted for laser sintering said particles of electrically conductive material. Also the insulating layer of particles of electrically insulating material may be laser sintered by the laser device. After the electric conductor elements and the insulating layer have been laser sintered, i.e. after the application of laser radiation onto their particles of electrically conductive and electrically insulating material, they are solidified and thus their shape has become fixed in a predetermined pattern. In addition, melting of the particles and subsequent solidifying results in an integrally formed conductor element without grain boundaries at which oxidation may occur, leading to an increased resistance of the conductor element. The laser device is arranged "behind" any devices provided for application of particles of electrically conductive and/or electrically insulating material when seen in the moving direction of the devices so that irradiation subsequent to application of the particles is easily possible.

In a further preferred embodiment prior to the step of attaching said foil sheet on the inner side of said fuselage element, at least one power supply cable is attached to the inner side of said fuselage element at such a position, that the power supply cable is sandwiched between said foil sheet and the inner side of the fuselage element. Such power supply cable may operate as an electric backbone for the electric system applied on the foil sheet and may supply electric power to the electric conductor elements on said foil sheet. As said backbone power supply cables usually do not need to be customized and in order to reduce dimensions of the foil sheet, said power supply cable is not included within the foil sheet.

In yet a further embodiment prior to the step of attaching said foil sheet on the inner side of said fuselage element, at least one data transmission cable is attached to the inner side of said fuselage element at such a position, that the data transmission cable is sandwiched between said foil sheet and the inner side of the fuselage element. Such data transmission cable may operate as a data backbone for the electric system applied on the foil sheet and may supply data to the electric conductor elements on said foil sheet.

In particular, it is preferred that the power supply cable and/or the data transmission cable are/is inductively coupled to an electric conductor element on said foil sheet. Coils may be provided on said foil sheet or on the respective power supply or data transmission cable. In such a manner the foil sheet may be provided with electric power and/or data, without the foil sheet being directly connected to said power supply cable/data transmission cable. An uncomplicated removal of the foil sheet without detaching from the power supply or data transmission cable is therefore possible.

In another aspect of the present invention an aircraft fuselage element being provided with an electric system, the fuselage element having an outer skin and a plurality of supporting elements extending along the interior surface of the outer skin, said fuselage element further comprising a foil sheet of an electrically insulating substrate material, attached on the inner side of said fuselage element, wherein particles of electrically conductive material are deposited onto the inner surface of said foil sheet opposite the outer skin in a predetermined pattern, such that the accumulated particles of electrically conductive material form electric conductor elements along the inner surface of said foil sheet.

In such a manner by employing a foil sheet attached to the inner side of the fuselage element as a substrate element and coated electric conductor elements onto said foil sheet a simple and flexible electric system is provided which can be quickly installed into a fuselage. Said foil sheet coated with electric conductor elements can easily be removed and replaced by a new plain uncoated foil sheet which, subsequently, can be coated with e.g. an updated or again customized version of an assembly of electric conductor elements. Thus, the advantages mentioned in relation to the method discussed before are achieved as well by the fuselages or fuselage sections according to the present invention.

BRIEF DESCRIPTION OF THE DRAWINGS

In the following preferred embodiments of the method and the aircraft fuselage element according to the present invention are described by means of a drawing. The drawing shows in FIG. 1 a flow diagram illustrating an embodiment of the method for installing an electric system into an aircraft fuselage, FIG. 2 a perspective view of a fuselage element and a foil sheet according to the present invention, FIG. 3 a perspective view of the fuselage element and foil sheet shown in FIG. 2, the foil sheet being attached on the inner side of said fuselage element and coated by means of an ink jet printing device, FIG. 4 a cross sectional view of the foil sheet attached to the fuselage element shown in FIG. 3, said foil sheet being coated by means of an ink jet printing device and laser sintered by means of a laser device, and FIG. 5 a cross sectional view of the foil sheet attached to the fuselage element shown in FIG. 4, provided with complete electric conductor elements and an insulating layer.

DETAILED DESCRIPTION

Figure 1:
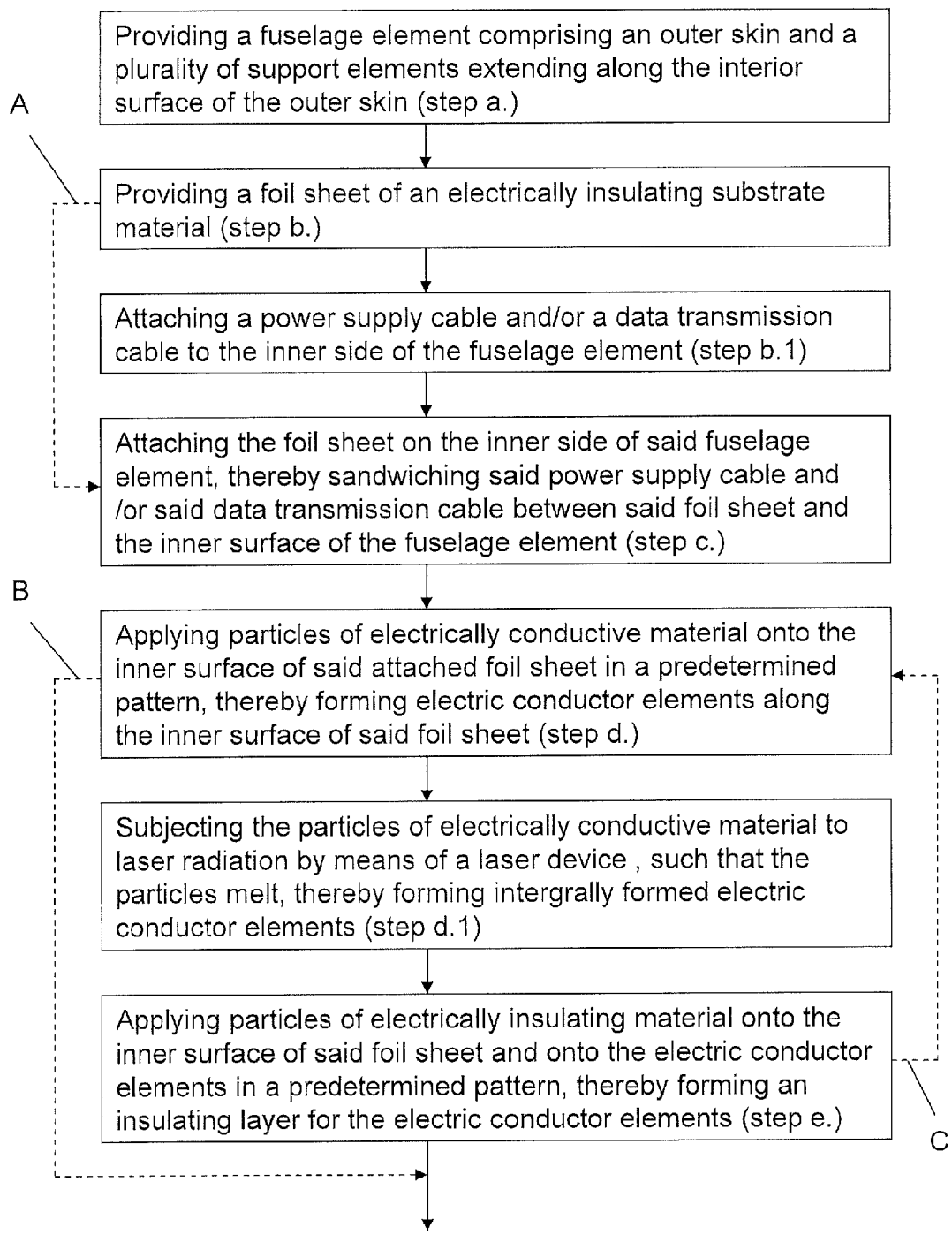

In FIG. 1 a flow diagram is shown illustrating the method steps of an embodiment of the method for installing an electric system 1 into an aircraft fuselage according to the present invention.

Figure 2:
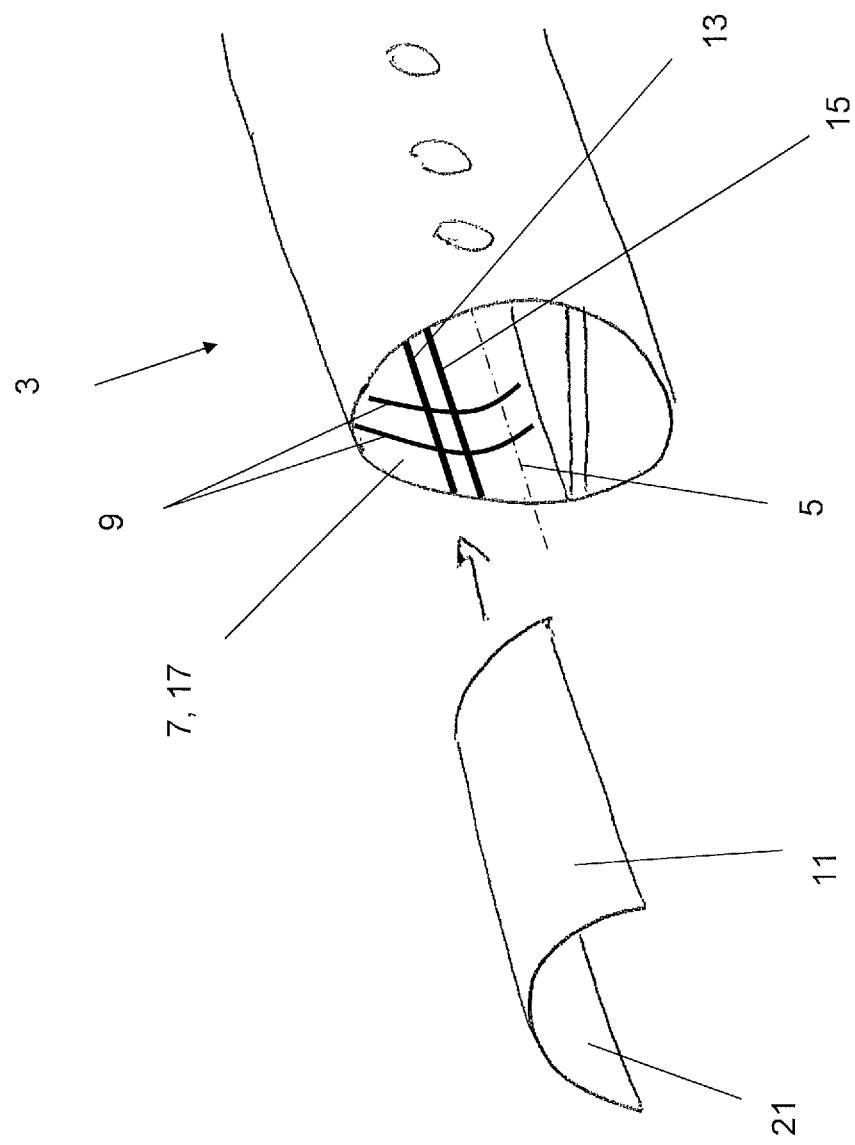

As a first step a fuselage element 3 extending along an aircraft longitudinal axis 5 and comprising an outer skin 7 and a plurality of support elements 9 extending along the interior surface of the outer skin 7 is provided (step a.), as illustrated in FIG. 2. The fuselage element 3 may be an entire fuselage or only a fuselage section, said fuselage section forming either a section with respect to either the aircraft longitudinal axis 5 or an angular section of the essentially cylindrically shaped fuselage. The support elements 9 may be e.g. frames and stringers.

The next step involves providing a foil sheet 11 of an electrically insulating substrate material (step b.), see e.g. FIG. 2. In the present embodiment the substrate material is a light-weight and flexible material which has considerable high electric resistance and the surface of which has at least average adhesion properties, so that it may be coated via common coating technologies such as ink jet printing.

Further, a power supply cable 13 and a data transmission cable 15 are provided and attached to the inner side 17 of the fuselage element 3 (step b.1), as shown in FIG. 2. The power supply cable 13 and the data transmission cable 15 serve as power backbone and data backbone, respectively, for the fuselage element 3 and are formed separate from the foil sheet 11, i.e. are not directly connected to the foil sheet 11. The power supply cable 13 and the data transmission cable 15 extend in this preferred embodiment essentially parallel to the aircraft longitudinal axis 5.

Figure 3:
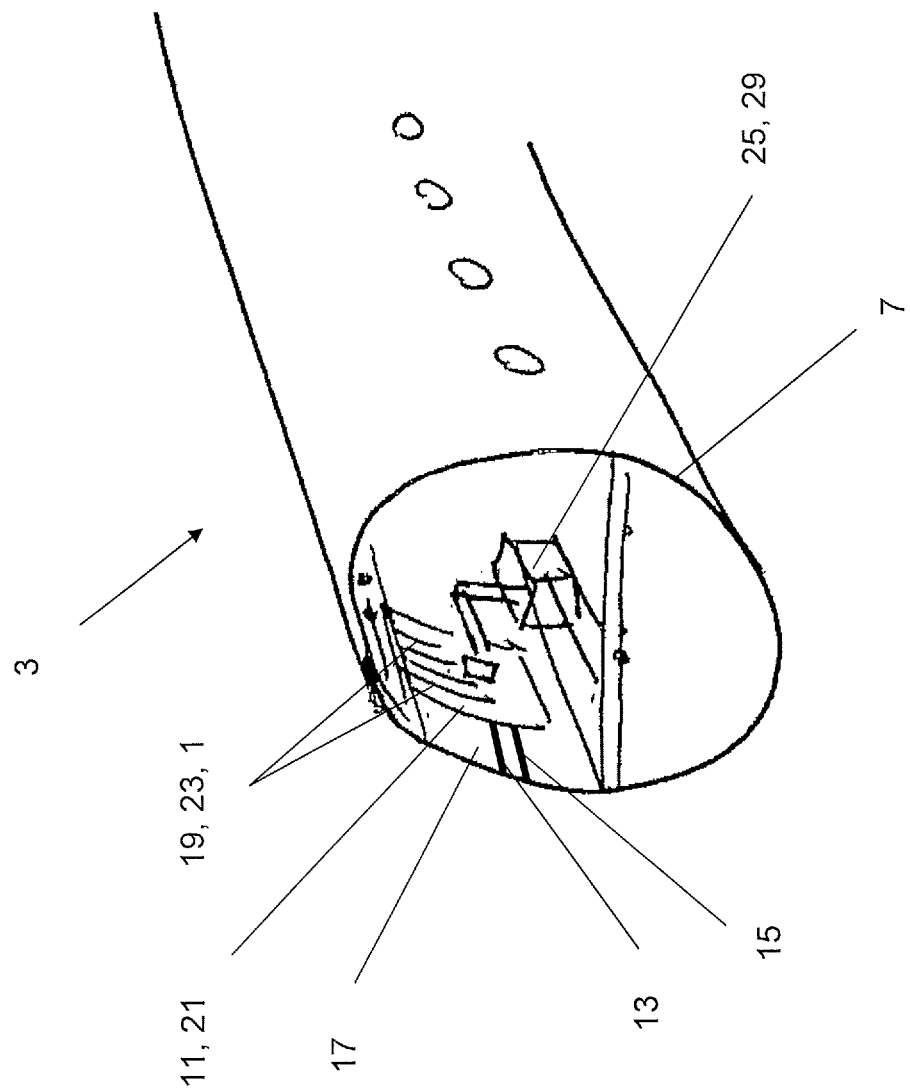

In the following step the foil sheet 11 is attached on the inner side 17 of said fuselage element 3, wherein said power supply cable 13 and said data transmission cable 15 are sandwiched between said foil sheet 11 and the inner side 17 of the fuselage element 3 (step c.), as it is illustrated in FIG. 3. The foil sheet 11 is attached to the inner side 17 of the fuselage element 3, in particular to the inner side of the support elements 9, in such a way that it may not move or shake during operation of the respective aircraft. Further, the foil sheet 11 is adapted to the shape of the inner side 17 of the fuselage element 3, i.e. bent into a curved form.

According to the next step particles of electrically conductive material 19 are applied onto the inner surface 21 of said attached foil sheet 11 opposite the outer skin 7 in a predetermined pattern, such that the accumulated particles of electrically conductive material 19 form electric conductor elements 23 along the inner surface 21 of said foil sheet 11 (step d.), as it is illustrated in FIGS. 3 and 4.

Basically, any electrically conductive material may be applied, such as aluminium, wolfram, brass, iron, chrome, or associated alloys, a semiconductor material such as silicon, or a non-metallic material such as graphite, but in the present embodiment particles of copper material are applied. In the preferred embodiment described herein said particles of electrically conductive material 19 are applied by an ink jet printing device 25 which is controlled by a computer controlled device. The predetermined pattern in which the particles of electrically conductive material 19 are applied corresponds to the desired shape of the electric conductor elements 23 extending on the inner surface 21 of the foil sheet 11. Further, means are provided on said foil sheet 11 and on said power supply cable 13 and data transmission cable 15 to inductively couple the power supply cable 13 and the data transmission cable 15 to an electric conductor 23 element on said foil sheet 11. Said means may be coils. In particular said coils may be arranged on the foil sheet 11 by depositing a correspondingly shaped conductor element via the ink jet printing device 25. In such a way power and data may be transported through the respective power supply cable 13 and data transmission cable 15 to the electric conductor elements 23 on the foil sheet 11 without being directly connected to the foil sheet 11.

Subsequently, said particles of electrically conductive material 19 after being applied onto the inner surface 21 of the foil sheet 11 are subjected to laser radiation 27 by means of a laser device 29, such that the particles 19 melt due to the heat transferred to the particles 19 through the laser radiation 27, so that after solidification forming integrally formed electric conductor elements 23 are achieved (step d.1; see FIG. 4). In such a manner the particles of electrically conductive material 19 are laser sintered and grain boundaries at which oxidation may occur, are removed. The laser device 29 may be connected to the ink jet printing device 25 and may be moved together with said ink jet printing device 25 along the inner surface 21 of said foil sheet 11 in a moving direction D, wherein the laser device 29 is arranged directly behind, i.e. downstream to, the ink jet printing device 25.

As a final step particles of electrically insulating material 31 are applied onto the inner surface 21 of said foil sheet 11 and onto the electric conductor elements 23 in a predetermined pattern, such that the accumulated particles of electrically insulating material 31 form an insulating layer 33 for the electric conductor elements 23 (step e.), as illustrated in FIG. 5. The insulating material may be a plastic, ceramic, or lacquer material. The predetermined pattern is of such a form that the electric conductor elements 23 are insulated to the environment, but no insulating material is wasted. The particles of electrically insulating material 31 may be applied onto the inner surface 21 of said foil 11 sheet and onto the electric conductor elements 23 by means of an ink jet printing device 25, and may be subjected to laser radiation 27 by a laser device 29 in order to be laser sintered, as it was the case with respect to the particles of electrically conductive material 19. The same or another ink jet printing device 25 and laser device 29 may be employed for applying both the particles of electrically conductive and electrically insulating material 19, 31.

As indicated by dashed arrow C, steps d. and e. may be carried out repeatedly in such an order and by means of such predetermined patterns that an electric circuit element 35 having a layered structure is formed on the inner surface 21 of said foil sheet 11, i.e. electric conductor elements 23 are formed in a certain shape having multiple layers with insulating layers 33 being interposed between the layers of electric conductor elements 23 where necessary, so that as a result an electric circuit element 35 is formed. Such an electric circuit element 35 may be a resistor, a diode, a transistor, a capacitor, an inductor, an operational amplifier, or other circuit elements.

Moreover, it should be noted that it is within the scope of the present invention that a layer of particles of electrically insulating material 31 may directly be deposited onto the foil sheet 11 before the electrically conductive material 19 is deposited, i.e. step e. may be carried out before step d. In addition, it is also within the scope of the invention if the steps of attaching power supply and/or data transmission cables 13, 15 (step b.1) or of curing the deposited material 19, 31 by means of laser irradiation (step d.1) are omitted as indicated by arrows A and B.

As a result, with the method according to the present invention an aircraft fuselage element 3 is provided with an electric system 1 in a cost effective manner. The fuselage element 3 has an outer skin 7 and a plurality of support elements 9 extending along the interior surface of the outer skin 7. Said fuselage element 3 further comprises a foil sheet 11 of an electrically insulating substrate material which is attached on the inner side 17 of said fuselage element 3. Onto the inner surface 21 of said foil sheet 11 opposite the outer skin 7 particles of electrically conductive material 19 are deposited in a predetermined pattern, wherein the accumulated particles of electrically conductive material 19 form electric conductor elements 23 along the inner surface 21 of said foil sheet 11. Electric circuit elements 35 may be formed by said electric conductor elements 23. Further, particles of electrically insulating material 31 are deposited onto the inner surface 21 of said foil sheet 11 and onto the electric conductor elements 23 in a predetermined pattern, wherein the particles of electrically insulating material 31 form an insulating layer 33 for the electric conductor elements 23. A power supply cable 13 and a data transmission cable 15 are attached on the inner side 17 of said fuselage element 3 at a position, where they are sandwiched between the foil sheet 11 and the inner side 17 of the fuselage element 3. Said power supply cable 13 and said data transmission cable 15 are inductively coupled to electric conductor elements 23 on the foil sheet 11.

By means of the before described method an electric system 1 can easily and quickly be installed and exchanged in an aircraft fuselage. Moreover, an aircraft fuselage element 3 provided with an electric system 1 installed and formed in such a way is highly efficient in view of weight and interior space.

The invention claimed is:

1. A method for installing an electric system into an aircraft fuselage, the method comprising:
   a. providing a fuselage element extending along an aircraft longitudinal axis and comprising an outer skin and a plurality of support elements extending along an interior surface of the outer skin,
   b. providing a foil sheet of an electrically insulating substrate material,
   c. attaching the foil sheet on an inner side of the fuselage element, and
   d. applying particles of electrically conductive material onto an inner surface of the attached foil sheet opposite the outer skin in a predetermined pattern, such that the applied particles of electrically conductive material form electric conductor elements along the inner surface of the foil sheet,
   wherein, prior to attaching the foil sheet on the inner side of the fuselage element, at least one power supply cable is attached to the inner side of the fuselage element at such a position that each of the at least one power supply cables is sandwiched between the foil sheet and the inner side of the fuselage element.

2. The method according to claim 1, wherein, subsequent to applying particles of electrically conductive material onto the inner surface of the foil sheet, a following step is performed:
   e. applying particles of electrically insulating material onto the inner surface of the foil sheet and onto the electric conductor elements in a predetermined pattern, such that the applied particles of electrically insulating material form an insulating layer for the electric conductor elements.

3. The method according to claim 2, wherein step d. and step e. are carried out repeatedly in such an order and by such predetermined patterns that an electric circuit element having a layered structure is formed on the inner surface of the attached foil sheet.

4. The method according to claim 1, wherein the particles of electrically conductive material and/or the particles of electrically insulating material are applied onto the inner surface of the foil sheet and onto the electric conductor elements, respectively, by an ink jet printing device.

5. The method according to claim 1, wherein, subsequent to applying particles of electrically conductive material onto the inner surface of the foil sheet, a following step is performed:
 d.1 subjecting the particles of electrically conductive material to laser radiation by a laser device, such that the particles melt due to the heat transferred to the particles through the laser radiation, thereby forming integrally formed electric conductor elements.

6. The method according to claim 1, wherein, prior to the step of attaching the foil sheet on the inner side of the fuselage element, at least one data transmission cable is attached to the inner side of the fuselage element at such a position that each of the at least one data transmission cables is sandwiched between the foil sheet and the inner side of the fuselage element.

7. The method according to claim 1, wherein each of the at least one power supply cables is inductively coupled to one or more of the electric conductor elements on the foil sheet.

8. An aircraft fuselage element having an electric system, the aircraft fuselage element comprising:
 an outer skin and a plurality of support elements extending along an interior surface of the outer skin and
 a foil sheet of an electrically insulating substrate material attached on an inner side of the fuselage element,
 wherein particles of electrically conductive material are deposited onto an inner surface of the attached foil sheet opposite the outer skin in a predetermined pattern such that the deposited particles of electrically conductive material form electric conductor elements along the inner surface of the foil sheet,
 wherein at least one power supply cable is attached to the inner side of the fuselage element at such a position that each of the at least one power supply cables is sandwiched between the foil sheet and the inner side of the fuselage element,
 wherein at least one data transmission cable is attached to the inner side of the fuselage element at such a position that each of the at least one data transmission cables is sandwiched between the foil sheet and the inner side of the fuselage element, and
 wherein each of the at least one power supply cables and/or data transmission cables are coupled to one or more of the electric conductor elements on the foil sheet.

9. The aircraft fuselage element according to claim 8, wherein particles of electrically insulating material are deposited onto the inner surface of the foil sheet and onto the electric conductor elements in a predetermined pattern such that the deposited particles of electrically insulating material form an insulating layer for the electric conductor elements.

10. The aircraft fuselage element according to claim 9, wherein layers of electrically conductive material and electrically insulating material are repeatedly deposited in predetermined patterns so that an electric circuit element having a layered structure is formed on the inner surface of the foil sheet.

11. The aircraft fuselage element according to claim 8, wherein the power supply cables and/or the data transmission cables are inductively coupled to the electric conductor elements on the foil sheet.

12. The method according to claim 6, wherein each of the at least one data transmission cables is inductively coupled to one or more of the electric conductor elements on the foil sheet.

* * * * *

UNITED STATES PATENT AND TRADEMARK OFFICE
CERTIFICATE OF CORRECTION

PATENT NO. : 9,663,246 B2
APPLICATION NO. : 14/016829
DATED : May 30, 2017
INVENTOR(S) : Eckart Frankenberger Page 1 of 1

It is certified that error appears in the above-identified patent and that said Letters Patent is hereby corrected as shown below:

On the Title Page

Item (71) Applicant:
Replace "Airbus Operations Gmbh"
With -- Airbus Operations GmbH --

Signed and Sealed this
Eighth Day of August, 2017

Joseph Matal
*Performing the Functions and Duties of the*
*Under Secretary of Commerce for Intellectual Property and*
*Director of the United States Patent and Trademark Office*